United States Patent
James et al.

(12) 
(10) Patent No.: US 6,375,559 B1
(45) Date of Patent: Apr. 23, 2002

(54) POLISHING SYSTEM HAVING A MULTI-PHASE POLISHING SUBSTRATE AND METHODS RELATING THERETO

(75) Inventors: David B. James, Newark, DE (US); William D. Budinger, Key West, FL (US); John V. H. Roberts, Newark, DE (US); Michael R. Oliver, Portland, OR (US); Nina G. Chechik; Richard M. Levering, Jr., both of Hockessin, DE (US); Lee Melbourne Cook, Steelville, PA (US)

(73) Assignee: Rodel Holdings Inc., Wilmington, DE (US)

( * ) Notice: Subject to any disclaimer, the term of this patent is extended or adjusted under 35 U.S.C. 154(b) by 0 days.

(21) Appl. No.: 09/384,607

(22) Filed: Aug. 27, 1999

Related U.S. Application Data

(63) Continuation of application No. 09/049,864, filed on Mar. 27, 1998, now Pat. No. 6,099,394, which is a continuation-in-part of application No. 09/021,437, filed on Feb. 10, 1998, now Pat. No. 6,022,264.
(60) Provisional application No. 60/042,115, filed on Mar. 28, 1997, provisional application No. 60/041,844, filed on Apr. 9, 1997, and provisional application No. 60/064,875, filed on Nov. 6, 1997.

(51) Int. Cl.$^7$ .............................................. B24D 11/00
(52) U.S. Cl. ...................... 451/527; 451/548; 451/550
(58) Field of Search .......................... 51/293, 295, 298, 51/307, 308; 451/56, 72, 527, 548, 550

(56) References Cited

U.S. PATENT DOCUMENTS

| | | | | | |
|---|---|---|---|---|---|
| 2,806,772 A | * | 9/1957 | Robie | ............................ | 51/296 |
| 3,840,357 A | * | 10/1974 | Shimizu | ........................ | 51/297 |
| 4,001,981 A | * | 1/1977 | Wood | | |
| 4,667,650 A | * | 5/1987 | Girard et al. | | |
| 4,788,798 A | * | 12/1988 | DeFranco et al. | ........... | 451/527 |
| 4,799,939 A | * | 1/1989 | Bloecher et al. | ............... | 51/293 |
| 5,152,917 A | * | 10/1992 | Pieper et al. | | |
| 5,209,760 A | * | 5/1993 | Wiand | ........................... | 51/293 |
| 5,435,816 A | * | 7/1995 | Spurgeon et al. | | |
| 5,527,368 A | * | 6/1996 | Supkis et al. | | |
| 5,647,879 A | * | 7/1997 | Kubo | ............................ | 51/307 |
| 5,722,106 A | * | 3/1998 | Masterman et al. | ......... | 451/527 |

\* cited by examiner

*Primary Examiner*—Timothy V. Eley
(74) *Attorney, Agent, or Firm*—Konrad Kaeding; Gerald K. Kita; Kenneth A. Benson

(57) ABSTRACT

A chemical-mechanical polishing system which is particularly well suited for use in the manufacture of semiconductor devices or the like. The invention is directed to a polishing pad composition comprising a high modulus phase component and a low modulus phase component. The multi-phase polishing pads are very efficient and effective in providing high performance polishing along an entire polishing surface interface.

14 Claims, 1 Drawing Sheet

POLISHING SYSTEM HAVING A MULTI-PHASE POLISHING SUBSTRATE AND METHODS RELATING THERETO

This application is a Continuation of U.S. application Ser. No. 09/049,864 filed Mar. 27, 1998, now U.S. Pat. No. 6,099,394, which is a Continuation-in-Part of U.S. application Ser. No. 09/021,437 filed Feb. 10, 1998, now U.S. Pat. No. 6,022,264, claiming the benefit of U.S. Provisional application Ser. No. 60/037,582 filed Feb. 10, 1997, and which claims the benefit of U.S. Provisional application Ser. No. 60/042,115 filed Mar. 28, 1997, U.S. Ser. No. 60/041, 844 filed Apr. 9, 1997, and U.S. Ser. No. 60/064,875 filed Nov. 6, 1997. This application is a continuation-in-part of U.S. application Ser. No. 09/021,437 filed Feb. 10, 1998.

BACKGROUND OF THE INVENTION

Field of the Invention

The present invention relates generally to high performance polishing systems for use in modifying a substrate by Hertzian indentation, fluid-based wear and/or any similar-type non-microgrinding mechanism; the polishing systems of the present invention are particularly well suited for use in the manufacture of semiconductor devices or the like. More particularly, the compositions and methods of the present invention are directed to polishing systems comprising an aqueous based polishing fluid and a polishing pad; the polishing pads of the present invention comprise a polishing layer having two separate phases: a high modulus phase and a low modulus phase.

Definition of Terms

1. Polishing. "Polishing" is intended to mean chemical-mechanical polishing (as opposed to micro-grinding) and is intended to include planarization and any corresponding variations thereof The polishing substrates contemplated by the present invention include semiconductor device substrates, such as, silicon, silica, gallium arsenide, silicon nitride, tungsten, tantalum, aluminum, copper, and any other semiconductor device substrate, whether conducting, semi-conducting or insulating.

2. Conditioning. In the art of chemical-mechanical polishing, conventional polishing pads generally must be conditioned or otherwise roughened to initially create, then periodically renew, the pad's polishing surface. Throughout this specification, "conditioning" is intended to mean mechanical and/or chemical surface treatment of a pad's polishing surface to generate nanoasperities.

3. Nanoasperities. Throughout this specification, "nanoasperities" are intended to mean:
   i. protrusions from the pad surface; and/or
   ii. particles which release from the pad surface,
having an imputed radius (of curvature) of about 0.5 to about 0.1 microns and sufficient resiliency to permanently deform (measured by the permanent change in curvature during polishing) by less than 25%, more preferably less than 10%.

4. Macro-Defects. Throughout this specification, "macro-defects" are intended to mean burrs or similar-type protrusions on the pad's polishing surface of greater than 0.5 microns in any dimension.

5. Particles. For purposes of the present invention, "particle" is intended to mean a discrete mass of material as it exists at the polishing interface. Hence, a "particle" can mean an independent, discrete primary particle, an agglomeration of primary particles which form a discrete mass, and/or primary particles which are aggregated together to form a discrete mass.

6. Self-dressing. Self-dressing is intended to mean that the polishing layer abrades, dissolves, wears or otherwise diminishes during the polishing operation, and as it diminishes, new nanoasperities are formed at the polishing interface, whether the pad is periodically conditioned during its useful life or not.

7. Low modulus phase. "Low modulus phase" is intended to mean the portion of the polishing layer which is separate and distinct from the high modulus phase and which defines a modulus of less than about 10 GigaPascals ("GPa").

8. High modulus phase. "High modulus phase" is intended to mean a portion of the polishing layer which is separate and discrete from the low modulus phase and which defines a modulus greater than about 10 GPa. The high modulus phase may further comprise a particle phase and a non-particle phase.

9. Pre-polymer. "Pre-polymer" is intended to mean any polymer precursor, including an oligomer, monomer, reactive polymer (including cross-linkable or curable polymers) and/or the like.

DISCUSSION OF THE PRIOR ART

During chemical mechanical polishing, abrasive particles are generally intended to be uniformly dispersed in a fluid along the entire polishing interface. Ideally, as new slurry is pumped into the polishing interface (and old slurry moves out of the polishing interface), the abrasive particle distribution remains substantially uniform throughout the polishing interface. With conventional polishing systems, such particle dispersion uniformity (at the polishing interface) is very difficult to achieve, particularly during initial polishing ("start-up"). Non-uniformity of particles at the polishing interface generally lowers polishing efficiency and performance.

Conventional polishing systems generally attempt to improve particle uniformity throughout the polishing interface by flowing large amounts of polishing slurries into the polishing interface and by using slurries with high loadings of abrasive particles. However with such conventional polishing systems, the substrate and polishing equipment generally require extensive cleaning after the polish. This cleaning step slows down production, is prone to operator error and can create environmental concerns.

A need therefore exists in the art for a polishing system which provides improved polishing uniformity along the polishing interface without the need for flowing large amounts of polishing slurries (having high particle loadings) into the polishing interface.

U.S. Pat. No. 5,435,816 to Spurgeon, et al, is directed to an abrasive article having a sheet-like structure for use in abrasion-type polishing of substrates.

SUMMARY OF THE INVENTION

The polishing systems of the present invention are directed to the placing of a polishing fluid (which may or may not contain abrasive particles) between a polishing pad and a work-piece to be polished. The pad comprises high modulus and low modulus domains which are exposed at the polishing interface. The work-piece and pad are moved relative to one another, while at least a portion of the polishing fluid is located within the interface between the pad and work-piece. The movement of the pad and/or work-piece and the interaction of the polishing fluid combine to provide (chemical-mechanical) polishing.

Polishing in accordance with the present invention is directed to the removal of surface protrusions by severing the chemical bonds between the protrusion and the surface. This mechanism occurs at a molecular level and is much different from micro-grinding. Micro-grinding occurs on a much larger scale, such as by surface fracturing, cutting or abrading.

Polishing pads in accordance with the present invention comprise a polishing layer created, at least in part, by solidifying a flowable material (including the sintering of flowable solids) into a hydrophilic, polishing layer matrix. Bonded within or onto the polishing layer matrix is a high modulus phase. The low modulus phase of the present invention can be incorporated within or onto the polishing layer matrix and/or can be the polishing layer matrix itself.

The polishing fluid is preferably water based and may also comprise polishing particles (in addition to any particles exposed by or released from the pad). The polishing fluid preferably comprises a pH modifier and optionally a pH buffer, surfactant, chelating agent, and/or oxidizer.

To provide consistency of polishing performance, any polishing pad flow channel(s) should have a configuration whereby as the pad wears to one half the average depth of the largest flow channel, the amount of surface area capable of contacting the substrate changes by less than 30%, more preferably less than 10% and most preferably less than 5%.

BRIEF DESCRIPTION OF THE DRAWINGS

FIG. 2 is a schematic side view of the polishing pad and polishing slurry of the present invention as used to planarize a substrate for use in the manufacture of a semiconductor device or the like.

DETAILED DESCRIPTION OF THE PREFERRED EMBODIMENT(S)

Overview

Figure 1:
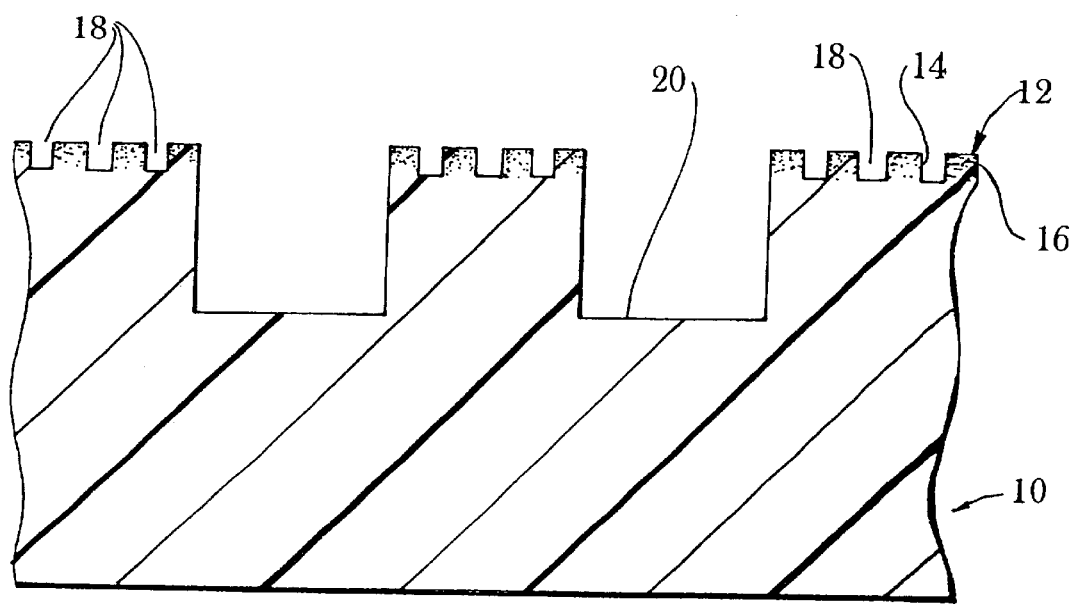
FIG. 1 is an enlarged end sectional view showing a polishing pad in accordance with the present invention.

The present invention is directed to a single layer or multi-layer polishing pad having a polishing layer containing at least a high modulus phase and a low modulus phase (each phase being discrete and separate from the other phase). Preferably, the weight ratio of the high modulus phase to the low modulus phase is in the range of 0.00005:1 to 10:1, more preferably 0.05:1 to 1:1.

The High Modulus Phase.

The high modulus phase can be a rigid organic, such as a thermoplastic, a rubber or a derivation thereof, or more preferably is a ceramic. Critical to the high modulus phase is that the modulus is greater than about 10 GPa. A preferred high modulus phase material is a ceramic particle, particularly an oxide, most particularly a metal oxide. High modulus phase particles which may be incorporated into the polishing layer material (and may also be incorporated into a polishing fluid), in accordance with the present invention include:

1. alumina,
2. silicon carbide,
3. chromia,
4. alumina-zirconia,
5. silica,
6. diamond,
7. iron oxide,
8. ceria,
9. boron nitride,
10. boron carbide,
11. garnet,
12. zirconia,
13. magnesium oxide,
14. titanium dioxide, and
15. combinations thereof.

As used in this specification, "particle size" is intended to mean the distance of the particle's largest dimension (either height, length or width). Preferred particles have an average particle size of less than or equal to about 0.6 microns but preferably greater than or equal to 0.05 microns; more preferably, at least 80 weight percent, more preferably 95 weight percent, and yet more preferably 100 weight percent, of the particles have a size in the range of 0.1 to 0.5 microns.

In one embodiment, the high modulus phase comprises at least about 50 weight percent, more preferably 80 weight percent and most preferably greater than 95 weight percent particles having an average surface area ranging from about 25 square meters per gram to about 430 square meters per gram and an average diameter or average aggregate diameter of less than about 1 micron, more preferably less than about 0.6 microns. Preferred oxide particles of the present invention are alumina, silica, iron oxide, titania and ceria.

The surface area of the particles can be measured by the nitrogen adsorption method of S. Brunauer, P. H. Emmet and I. Teller, J. Am. Chemical Society, Volume 60, page 309 (1938) which is commonly referred to as BET measurement. Aggregate size can be determined by known techniques, such as, that described in ASTM D3849-89; measurements can be recalled individually or in the form of statistical or histogram distributions. Aggregate size distribution can be determined by transmission electron microscopy (TEM) The mean aggregate diameter can be determined by the average equivalent spherical diameter when using TEM image analysis, i.e., based upon the cross-sectional area of the aggregate.

The Low Modulus Phase.

The polishing materials of the present invention have at least one low modulus phase that is sufficiently hydrophilic to provide a critical surface tension greater than or equal to 34 milliNewtons per meter, more preferably greater than or equal to 37 and most preferably greater than or equal to 40 milliNewtons per meter. Critical surface tension defines the wettability of a solid surface by noting the lowest surface tension a liquid can have and still exhibit a contact angle greater than zero degrees on that solid. Thus, polymers with higher critical surface tensions are more readily wet and are therefore more hydrophilic. Critical Surface Tension of common polymers are provided below:

| Polymer | Critical Surface Tension (mN/m) |
| --- | --- |
| Polytetrafluoroethylene | 19 |
| Polydimethylsiloxane | 24 |
| Silicone Rubber | 24 |
| Polybutadiene | 31 |
| Polyethylene | 31 |
| Polystyrene | 33 |
| Polypropylene | 34 |
| Polyester | 39–42 |
| Polyacrylamide | 35–40 |
| Polyvinyl alcohol | 37 |
| Polymethyl methacrylate | 39 |

-continued

| Polymer | Critical Surface Tension (mN/m) |
|---|---|
| Polyvinyl chloride | 39 |
| Polysulfone | 41 |
| Nylon 6 | 42 |
| Polyurethane | 45 |
| Polycarbonate | 45 |

In one embodiment, the low modulus phase is derived from at least:
1. an acrylated urethane;
2. an acrylated epoxy;
3. an ethylenically unsaturated organic compound having a carboxyl, benzyl, or amide functionality;
4. an aminoplast derivative having a pendant unsaturated carbonyl group;
5. an isocyanurate derivative having at least one pendant acrylate group;
6. a vinyl ether,
7. a urethane
8. a polyacrylamide
9. an ethylene/ester copolymer or an acid derivative thereof;
10. a polyvinyl alcohol;
11. a polymethyl methacrylate;
12. a polysulfone;
13. an polyamide;
14. apolycarbonate;
15. a polyvinyl chloride;
16. an epoxy;
17. a copolymer of the above; or
18. a combination thereof.

Preferred low modulus phase materials comprise urethane, carbonate, amide, sulfone, vinyl chloride, acrylate, methacrylate, vinyl alcohol, ester or acrylaride moieties (most preferably, urethane). The low modulus phase material also defines a modulus of 1 Pa to about 10 GPa. Preferably at least one low modulus phase component of the present invention defines an elongation to break in the range of 25% to 1000%, more preferably 50%–500% and most preferably 100%–350%. The low modulus phase material can be porous or non-porous. In one embodiment, a low modulus phase component is non-porous; in another embodiment, a low modulus phase material is non-porous and free of fiber reinforcement.

Multi-Phase Material

A multiphase material of the preferred embodiment of the present invention is manufactured by mixing an aqueous dispersion of high modulus phase material (or a precursor which can be converted into a high modulus phase material) with another phase (or a precursor to another phase) material (the other phase material may or may not be a low modulus phase material). The other phase material is preferably a polymer based material, such as a thermoplastic or a thermoset.

In a preferred embodiment, the dispersion of high modulus material is substantially free of particle agglomerations capable of scratching a semiconductor substrate. Particle agglomeration can be minimized by agitation or mixing of the dispersion shortly prior to intermixing the multi-phased material and solidifying (e.g., de-watering).

The low modulus material (or precursor thereto) can be 100% solids when mixed with the dispersion of high modulus material (or precursor thereto), but in a more preferred embodiment, the low modulus material is also a water based composition when mixed with the dispersion of high modulus material (or precursor thereto). Once these two components are adequately mixed (substantially complete blending of the one component within the other), the mixture is de-watered, such as by spray drying, oven drying or the like. As water is removed from the mixture, the resulting composition solidifies, with or without chemical reaction. Possible chemical reactions include curing, grafting, crosslinking, chain extension or the like.

In a highly preferred embodiment, an aqueous dispersion of submicron silica particles is vigorously mixed into a urethane latex and de-watered by oven drying. The urethane component of the urethane latex can be a polymer or in the alternative, can be a prepolymer which forms a final urethane polymer by a chemical reaction, such as by, chain extension, crosslinking or the like.

The multi-phased material comprises a high modulus phase in accordance with the present invention. In some embodiments, the multiphase composition may also include low modulus phase material. Generally, the high modulus phase will be the continuous phase, and the other phase is the discontinuous phase, but in alternative embodiments of the present invention, the continuous phase can be the high modulus phase.

The multiphase material can be formed into a polishing layer by casting, molding, skiving or other mechanical manipulation. In accordance with the present invention, if the multi-phased material is formed into a polishing layer, the multi-phased material must also comprise a low modulus phase.

Alternatively, the multiphase material can be broken down into small pieces, hereafter referred to as "clusters", by milling or any other particle producing process. The multiphase clusters can then be incorporated into a conventional or non-conventional pad matrix material to thereby provide a multiphase pad, whereby the multiphase component is in a particle format within a pad matrix. The pad matrix will generally be yet another phase of material, and hence, such embodiments of the present invention will define more than two phases. Critical to the present invention is that the polishing pad have at least two phases—a high modulus phase (greater than about 10 GPa) and a separate low modulus phase (less than about 10 GPa). The pad (polishing layer) matrix can be the same or different from either phase in the multi-phase material. In a preferred embodiment, the pad matrix and a phase of the multi-phase particulated material are generally different, but both are low modulus phase materials.

A possible polishing layer matrix precursor is one capable of being cured or polymerized via any appropriate polymerization mechanism, such as substitution, addition or condensation polymerization reactions. Possible precursors include acrylated urethanes, acrylated epoxies, ethylenically unsaturated compounds, aminoplast derivatives having pendant alpha, beta-unsaturated carbonyl groups, isocyanurate derivatives having at least one pendant acrylate group, isocyanate derivatives having at least one pendant acrylate group, and combinations thereof.

Optionally, a diluent can be added to any phase of the present invention to soften or otherwise lower the modulus of the material, thereby making the phase more prone to wear, to dissolving or to otherwise diminishing during polishing. In one embodiment, the diluent is a polyol, such as, polyethylene glycol, methoxypolyethylene glycol, polypropylene glycol, polybutylene glycol, glycerol, polyvinyl alcohol, and combinations thereof. In one embodiment, the diluent is polyethylene glycol having an average molecular weight of from 200 to 10,000 and comprising 20 to 60 weight percent of the matrix material.

Optionally, an oxidizing component can be incorporated into the low modulus phase material to promote oxidation of a metal layer to its corresponding oxide. For example, an oxidizing component can be used to oxidize tungsten to tungsten oxide; thereafter, the tungsten oxide can be chemically and/or mechanically polished and removed. Preferred oxidizing components for incorporation into the low modulus phase include oxidizing salts, oxidizing metal complexes, iron salts, such as nitrates, sulfates, potassium ferri-cyanide and the like, aluminum salts, quaternary ammonium salts, phosphonium salts, peroxides, chlorates, perchlorates, pennanganates, persulfates and mixtures thereof. The amount should be sufficient to ensure rapid oxidation of the metal layer while balancing the mechanical and chemical polishing performance of the system.

Other possible additives include fillers, fibers, lubricants, wetting agents, pigments, dyes, coupling agents, plasticizers, surfactants, dispersing agents and suspending agents. The polishing pad matrix material can comprise up to 80 weight percent filler and other optional ingredients. Examples of optional additives include EDTA, citrates, polycarboxylic acids and the like. Although certain clays have been described as being capable of acting as polishing particles, for purposes of the present invention, the presence of clay materials within the low modulus phase are to be deemed as filler, not (high modulus phase) polishing particles.

Particle Clusters

High modulus phase materials, particularly sub-micron ceramic particles tend to agglomerate into much larger sized particles, and this can be a problem, when creating the high modulus phase of the present invention. Such particle agglomeration can lead to scratching and can adversely affect polishing performance.

One way to avoid such unwanted agglomeration is to first: 1. mix the particles with a suitable binder, whereby the binder is initially in a flowable form; 2. agitating or stirring the mixture to thereby break up particle agglomerations and cause dispersion of the particles within the flowable binder; 3. Curing, de-watering or otherwise solidifying the binder, thereby dispersing the particles within a (now) solid binder, and thereby also preventing the particles from re-agglomerating; and 4. grinding or otherwise breaking the resulting material into fragments. The resulting fragments will hereafter be referred to as "particle clusters." The particle clusters are then incorporated into or bonded onto the polishing layer matrix material, and the particles are thereby incorporated into the polishing pad, substantially free of unwanted particle agglomeration. The binder and/or the pad matrix can provide the low modulus phase of the present invention.

The use of particle clusters is also advantageous, because it has been found that ceramic particles (without a binder) tend to weaken the pad's mechanical structure, due to poor adhesion between the particles and the pad matrix. Such decreased mechanical integrity is far less prevalent with the use of particle clusters, particularly where a binder is chosen which is more compatible with or otherwise more effectively binds to the pad matrix.

The particle cluster binder material can be optimized for specific polishing applications. The particle type, concentration and distribution can be adjusted within the binder to further optimize polishing performance for specific applications.

A Preferred Method of Fabricating Particle Clusters

According to one embodiment of the present invention, particle clusters are fabricated by mixing an aqueous dispersion of polishing particles, preferably colloidal, submicron metal oxide ceramic particles, with an aqueous dispersion of urethane prepolymer. The urethane (in either its liquid pre-polymer state or its solid cured state) will hereafter be referred to as the "intra-cluster binder." The intra-cluster binder may be, but is not limited to, urethane, epoxy, acrylic-urethane, polyacrylamide, polymethylmethacrylate, polyamide, polycarbonate, polyvinylalcohol and polysulfone.

Useful particles can include, but are not limited to, $SiO_2$, $Al_2O_3$, $TiO_2$ and $CeO_2$. Particle sizes are preferably in the range of 10–1000 nm, more preferably 30–500 nm and most preferably 50–300 nm. Preferred concentrations of particles in the particle cluster are greater than 50 weight percent, more preferably greater than 75 weight percent and most preferably above 90 weight percent.

The resulting particle/particle binder mixture is preferably dried to remove water. Drying techniques may include oven drying, evaporation, spray-drying, etc. The resulting material is ground or milled into a fine powder, each granule of which constitutes a particle cluster. Grinding may be done by a mortar and pestle, roll mills, high-speed grinders, or other similar means. In one embodiment, the material may be ground into particle clusters ranging in size from 10–1000 $\mu$(microns), preferably 25–500 $\mu$, and more preferably 35–150 $\mu$. The preferred size of the particle clusters will be governed by the size of the polishing particles, the grinding method and the polishing application for which they are produced.

In some instances, where conditioning is not desired, it is advantageous to achieve compositions which are somewhat friable (e.g., crumble under shear forces, preferably of less than 1000 Newtons). Friability allows a fresh supply of particles to be continuously introduced into the polishing fluid. Friability is achieved by high filler loadings and/or by use of high glass transition temperature polymers (glass transition temperatures preferably greater than 25 degrees Centigrade). When filler loadings are high, the particles are generally not fully surrounded by the polymer, creating a relatively brittle material. High glass transition temperature polymers tend to produce brittle matrices rendering the material relatively friable. Therefore, the rate of introduction of particles into the polishing fluid can be controlled by varying the particle loading and the intra-cluster binder (e.g., polymer).

Particle behavior during polishing is generally determined by how well the particles are held by the intra-cluster binder. The binder material and the particles can be optimized for best polishing performance. The concentration and properties of the particles within the particle cluster can be changed independent of the bulk properties of the polishing layer matrix. The size and concentration of the particle clusters within a polishing layer can also be varied to optimize performance.

Fabrication of Polishing Articles Containing Particle Clusters

In one embodiment of the present invention, particle clusters are incorporated into the polishing layer matrix by mixing the clusters into a flowable polishing layer matrix precursor and solidifying the matrix by curing, cooling or any other solidification operation. Alternatively, the particle clusters are bonded to the polishing layer matrix, while the matrix is in a flowable or non-flowable state.

Useful manufacturing techniques may include, but are not limited to, molding, casting, extrusion, spray-coating, web-coating, printing, sintering, photopolymerization, or the like. Additional processing may also be incorporated into the polishing pad manufacturing process, such as grooving, skiving, felting and foaming or the like. Grooving is intended to mean producing recesses of any shape on the article's polishing surface.

In one embodiment of the present invention, the polishing layer matrix (prior to solidification) with particle clusters dispersed therein is coagulated or otherwise coated and solidified upon a substrate, such as a felt or polymer film. Coagulation can form a porous, particle-containing material.

The particle clusters can be dispersed in liquid urethane precursors used in existing processes for the manufacture of polishing articles. The loading of particle clusters may be in the range of 1–95 weight percent. More preferably the particle loading is in the range of 10–90 and most preferably in the range of 25–85 weight percent. The concentration of the particle clusters can be varied over a wide range to achieve desired characteristics for different applications. For instance, high loading increases friability. Compositions preventing particle cluster agglomeration allow uniform distribution to be achieved.

The particle clusters should not interact chemically with the bulk constituents of the article in ways that would inhibit their performance. However, the inter-cluster polymeric matrix chemistry may be adjusted to obtain desired behavior of the particle clusters within the matrix. For instance, adjustments to the inter-cluster polymer chemistry may allow the particle clusters to attach to a surface of the article instead of being distributed evenly throughout.

In one embodiment the mixture of particle clusters in the inter-cluster polymeric matrix is transferred to a mold. The mixture is allowed to gel and then cured at elevated temperatures. The solidified cake is brought to room temperature and removed from the mold. The cake is skived, or similarly sectioned, to form polishing articles of desired thickness'. The articles may be used in this form or layered with other articles such as foams depending on the application. The top layers may be perforated or grooved.

In an alternative embodiment particle clusters may be dispersed in a water soluble polymer to allow release of particle clusters into an aqueous polishing fluid during use. Examples of such polymers include, but are not limited to, polyvinylalcohol or polyacrylamide.

Particle clusters may be mixed with an inter-cluster polymeric binder, preferably an aqueous dispersible polymer, then sprayed onto a substrate to form a polishing article. The preferred loading of particle clusters may be 5–95 weight percent, more preferably 20–90 weight percent, and most preferably 40–85 weight percent. The mechanical integrity of a sprayed article is dictated by the substrate. Therefore, the particle cluster loading can be higher in sprayed mixtures than in matrices that form an entire polishing article (or polishing article layer for a composite article). The substrate may be any material possessing the flexibility, elasticity and other properties necessary for successful polishing. The inter-cluster polymeric binder and substrate must have sufficient adherence to one another so that the particle clusters release the polishing particles more readily than the substrate releases the binder.

Particle clusters may be sprayed in layers. Each layer is dried and either totally or partially cured before application of subsequent layers. Preferably surfactants are added to the inter-cluster binder to enhance adhesion between layers. Layering serves to increase the thickness of the article, thereby increasing longevity. Layering also provides a means to vary the polishing capabilities within a single article. For example, layers may vary in particle size, type or loading, or in particle cluster type, size or loading. Also a single layer may contain different types, sizes or concentrations of particle clusters.

The rate of particle release into the polishing fluid can be controlled by varying the particle loading of the cluster, the particle cluster loading of the material, or by varying the types and ratios of all other materials comprising the clusters and polishing layer matrix.

In one embodiment of the present invention, particle clusters are mixed gradually into a reactive precursor to the polishing layer matrix. Once formed, the polishing layer matrix will comprise the low modulus phase and the particle clusters (which comprise a high modulus phase) are dispersed within the matrix. Examples of suitable mixing techniques include low shear and high shear mixing; high shear mixing being preferred. Ultrasonic energy may also be utilized in combination with the mixing step to lower the dispersion viscosity. The amount of air bubbles in the dispersion can be minimized by pulling a vacuum during or after the mixing step. In some instances, it may be preferred to add heat during mixing, generally in the range of 30 to 70 degrees Centigrade, to lower viscosity. The dispersion should have a rheology that coats well and in which the particles and other fillers do not settle.

A preferred matrix precursor material comprises a free radical curable component. Such polymerization can generally be initiated upon exposure to thermal or electromagnetic energy, depending upon the free radical initiator chemistry used. The amount of energy necessary to induce polymerization depends upon several factors such as the binder precursor chemistry, the dimensions of the matrix precursor material, the amount and type of particles and the amount and type of optional additives. Possible radiation energy sources include electron beam, ultraviolet light or visible light. Electron beam radiation, which is also known as ionizing radiation can be used at an energy level of about 0.1 to about 10 Mrad, preferably within the range of about 250–400 nanometers.

Also preferred is visible light radiation in the range of about 118 to 236 Watts per centimeter; visible radiation refers to non-particulate radiation having a wavelength within the range of about 400 to about 800 nanometers, preferably in the range of about 400 to 550 nanometers. It is also possible to use thermal energy to initiate the free radical polymerization, provided the polymerization chemistry is adaptable to thermally induced free radical initiation and curing.

In a preferred embodiment, the resulting mixture (of low modulus phase, polishing layer matrix precursor, particle clusters and optional ingredients, if any) is then applied to a substrate as the precursor is solidified (e.g., polymerized) to create a polishing layer comprising a high modulus phase (found within the clusters) and a low modulus phase (the polishing layer matrix and/or a second phase within the cluster). The substrate upon which the mixture is applied can be left bonded to the mixture to form a multilayer pad. In such an embodiment, the polymerization reaction should induce adhesion between the substrate and matrix material, and the substrate should be prone to surface wetting by the precursor matrix material.

In an alternative embodiment, the solidified mixture is peeled away from the substrate (such as a mold) to form a monolayer. This monolayer can be used as a pad or additional layers can be applied to the monolayer to provide a multilayered pad. Regardless of whether the final pad is a monolayer or multilayer, the multi-phased material will define at least one polishing surface of the pad.

The pad layer (pad matrix containing particle clusters) can be partially or wholly solidified upon a belt, a sheet, a web, a coating roll (such as a rotogravure roll, a sleeve mounted roll) or a die. The substrate can be composed of metal (e.g., nickel), metal alloys, ceramic or plastic. The substrate may contain a release coating (e.g., a fluoropolymer) to permit easier release of the cured material from the substrate.

The partial or complete solidification of the polishing layer can occur with the mixture in contact with a mold or other means to induce a three dimensional pattern upon a surface of the mixture. Alternatively, the surface of the mixture can be modified by any available technique, such as, photolithography and/or machining. In yet another alternative embodiment, the matrix surface is not modified, but rather, the surface texture remains as was naturally produced when hardening (e.g. polymerizing) the precursor to provide the solid matrix material.

Flow Channels

Conventional polishing pads generally perform better with a series of large and small flow channels. In a preferred embodiment of the present invention, the flow channels continuously evolve (some are created as others diminish), as the multi-phase material abrades, dissolves or otherwise diminishes.

To provide consistency of polishing performance, any flow channel(s) should have a configuration (such as rods or cylinders perpendicular to the pad's surface) whereby as the pad wears to one half the average depth of the largest flow channel, the amount of surface area capable of contacting the substrate changes by less than 25%, more preferably less than 15% and most preferably less than 10%. In one embodiment, substantially all flow channels define a groove having a width which varies by no more than 20% (more preferably no more than 10%) between the top and bottom of the groove.

In another embodiment, pads in accordance with the present invention have a pyramidal, truncated pyramidal or other three dimensional surface texture, whereby the polishing surface area will tend to change as the pad wears. To offset variations in polishing surface area during the useful life of the pad, the downward pressure upon the pad is adjusted to maintain a substantially constant frictional resistance between the pad and substrate.

Pad Longevity and "Self-Dressing"

High loadings of the high modulus phase will generally decrease pad life, since high loadings of the high modulus phase material will tend to release rigid domains and as these domains are released, the pad wears away. However such high loadings of the high modulus phase can be advantageous, because the release of high modulus domains renews the polishing surface of the polishing layer and thereby can decrease the amount of conditioning necessary during the life of the pad.

Such a decrease in pad conditioning is advantageous, because conditioning slows production, is labor intensive and presents an opportunity for operator error. The high modulus phase can be adjusted to fine tune the release of high modulus domains (e.g., particles), thereby influencing the amount of pad conditioning required during the pad's useful life.

Alternatively, by decreasing the high modulus domain loading, the polishing layer can become less friable, and this generally improves the pad's mechanical integrity and generally increases the pad's service life. Generally speaking, high modulus phase loadings above 50wt % tend to decrease the need for pad re-conditioning.

Recess-Filled Polishing Articles

In one embodiment of the present invention, an indentation (such as a groove) is incorporated into the polishing layer surface. The indentation is then filed with a filler comprising high modulus phase material. For example, a conventional polyurethane pad can be machined to form grooves on the polishing surface. The polyurethane pad matrix can comprise low modulus phase material and can be devoid of high modulus phase material. The grooves can then be filled with a composition comprising high modulus phase material. Once the indentations are filled (such as by spraying), the overall surface of the pad can be substantially planar. By controlling the geometry of the grooves, especially the width and by adjusting the density of the high modulus material within the recess, it is possible to equalize the wear rates of the pad and the filler within the indentation (s). In this way, the underlying pad can provide mechanical integrity and the filled grooves can act as a continuous source of nanoasperities.

Sintered Polishing Pads Containing Particle Clusters

In accordance with the present invention, polishing articles (comprising both a high modulus phase and a low modulus phase and containing particle clusters) may be fabricated by a sintering process. In a preferred embodiment, the process begins by mixing the particle clusters with low modulus phase material capable of being sintered. Concentrations of the low modulus phase can range from 5 to 95 weight percent, preferably from 20 to 90 weight percent, and more preferably from 40 to 85 weight percent, depending upon the concentration of particles in the clusters and the desired loading in the polishing article. As the concentration of particle clusters increases, the friability of the polishing material tends to also increase.

Low modulus phase materials preferably sinter at temperatures and pressures below the decomposition temperature/pressure of the selected particle clusters. Nylon is a low modulus phase material which is often suitable for sintering polishing pads of the present invention. Other possible low modulus phase materials which may also be suitable for sintering include: thermoplastic polyurethanes, polyvinyl chloride, polycarbonate, polymethylmethacrylate, polysulfone and combinations thereof.

In the preferred embodiment, once a dispersion of particle clusters within the low modulus phase material is achieved, the mixture is poured into a mold and heated for sufficient time and temperature to fuse the structure together. By varying the temperature, time and pressure, different degrees of sintering can be achieved. At one extreme, a fully dense material can be sintered with no residual porosity and with high mechanical strength. Alternatively with partial sintering, the resulting material generally has open channels and is often porous and friable, at least to some degree. Thus, the degree of sintering can be used as yet another way of controlling the friability, including the propensity for releasing (high modulus) particles. This unique characteristic of the present invention generally reduces or eliminates the need for article conditioning by continually generating a fresh article surface during polishing.

The mold used can contain grooves or any other shaped designs, the pattern of which under the process of molding produces recesses in the article. Recesses may also be incorporated into the article after its formation by methods such as embossing or the like.

Other methods of producing sintered articles include, but are not limited to, wet forming, powder compaction and electrophoretic deposition.

EXAMPLES

The present invention includes a method for polishing comprising the steps of: 1) formulating a polishing article having particle clusters incorporated therein; 2) introducing a polishing fluid, preferably containing little or no particulate material, between the article and a workpiece to be polished; and 3) producing relative motion between the article and workpiece. Following are examples further describing the articles and methods of the present invention. They are not intended to be restrictive in any way.

Example 1

This example describes one embodiment of particle cluster fabrication according to the present invention. A formulation was prepared having 5 weight percent A-100* and 95 weight percent $CeO_2$**. A 1935 g $CeO_2$ aqueous dispersion (the concentration of $CeO_2$ in the dispersion was 21.5%) was prepared and poured into a mixer. Using high shear mixing, 63 g of an aqueous dispersion of A-100 (concentration of 55%) was slowly added to the $CeO_2$ dispersion. Mixing continued for 30 min. The resulting mixture was poured into an aluminum pan and heated for fourteen hours at 60° C. until dried The dried mixture was ground by mortar and pestle to a fine powder. Each grain of powder represented a particle cluster.

*A-100—a water based colloidal dispersion of urethane and polyacrylate copolymer manufactured by Witco, Inc.
**$CeO_2$—water dispersion with a primary particle size of 200 nm, manufactured by Mitsui Chemical Company.

Example 2

This example describes a dispersion of particle clusters in an inter-cluster polymer.

TABLE 2

| Weight Percent of Cluster/Interpolymeric Binder Formulation | |
|---|---|
| W-242[x] | 52.4 |
| Particle Clusters (as prepared in example 1) | 27.5 |
| XW[x][x] | 1.0 |
| Velvetex BK-35[x][x][x] | 1.6 |
| Deionized water | 17.5 |

[x] W-242 urethane aqueous dispersion manufactured by Witco, Inc.
[x][x] XW epoxy aqueous dispersion manufactured by Witco, Inc.
[x][x][x] Velvetex BK-35 surfactant manufactured by Henkel Corporation Three-hundred grams of a W-242 aqueous dispersion, 157.5 g of particle clusters produced as in Example 1, 6.0 g of XW, 9.0 g of surfactant and 100 g deionized water were mixed in a laboratory jar-mill (with zirconia as a ball-mill medium) for fourteen hours. A spray-gun was used to spray the mixture on the surface of a grooved IC-1400 pad (polishing pad manufactured by Rodel, Inc., Newark, Del.). After spraying, the pad was heated in an oven at 60° C. for fourteen hours.

Example 3

This example describes one embodiment for a method of polishing. Thermal oxide wafers were polished using a polishing pad prepared in Example 2. The pad was mounted on a Strasbaugh 6CA polishing machine platen. The pad was rinsed with de-ionized water and conditioned with 200 grit diamond grid for 3 min. A particle-free polishing slurry ($NH_4OH$ (1.7%) in water) was introduced on the surface of the pad at a rate of 100 ml/min. A platen speed of 60rpm and a quill speed of 50 rpm were used. The pressure between the pad and the wafer was 8 psi. The wafer was polishing for 2 min. then rinsed with de-ionized water for 30 seconds. Seventy-five thermal oxide wafers were polished with one pad. There was no reconditioning between wafers. An average removal rate of 3000–3500 Å/min was achieved.

Pad Plus Slurry.

The polishing systems of the present invention comprise the (above described) polishing pad design in combination with a polishing slurry. Any particle containing polishing fluid can be used. Preferred polishing slurries comprise less than 95 weight percent particles, more preferably less than 40 weight percent particles, more preferably less than 25 weight percent particles and most preferably 0–10 weight percent particles. In one embodiment, the polishing fluid comprises an amine, polyol, carboxylic acid, halogen ion and/or oxidizing agent.

During polishing, preferred polishing fluids provide increased reactivity or corrosivity at the point of particle contact or interaction with a surface protrusion. For example, if the polishing fluid is more corrosive at higher temperatures, then corrosion will preferentially occur at this point of contact, since the temperature at the point of contact is generally higher than at non-contact portions of the surface. A particularly preferred polishing fluid provides a corrosion rate which increases as the protrusion is stressed (i.e., bond strain is induced) due to particle contact or interaction.

Dilute solutions of hydrofluoric acid are corrosive to $SiO_2$ and silicate materials. The rate of corrosion is sensitive to bond strain, particularly tensile strain. The corrosion rate increases by more than an order of magnitude. Such a reactive solution when used in accordance with the polishing pads of the present invention will generally result in a highly selective local removal in the proximal vicinity of the particle contact, due to the increased local bond strain in the substrate.

A preferred polishing slurry of the present invention for use in the polishing of silicon is a water based slurry, comprising about 0.05 to about 5 weight percent amine, preferably primary amine capable of receiving a free proton. In addition or in the alternative to the amine the following can be used: a halogen ion, particularly a fluoride ion; a hydroxyl ion; and/or a superoxide, such as peroxide, persulfate, permagnate or the like. A preferred pH for the polishing fluid of this embodiment is in the range of about 2–12.

Recycle of Polishing Fluid

In another embodiment, the polishing fluid is recycled back into the polishing operation. Prior to re-use, the polishing fluid can be filtered or otherwise processed or rejuvenated. If the slurry comprises a dilute hydrofluoric acid solution, the pH and HF concentration may be measured in situ before and after use. Provisions for additional HF into the slurry as needed to maintain a constant acid concentration and pH can be introduced into the recirculation system.

Similarly, for a slurry comprising 50 parts per million ozone in water at pH 4, the oxidation potential of the solution (which is directly proportional to the ozone concentration), and the pH may be measured with conventional electrodes; acid and ozone can then be added during the recirculation process to maintain consistency in polishing fluid performance.

Figure 2:
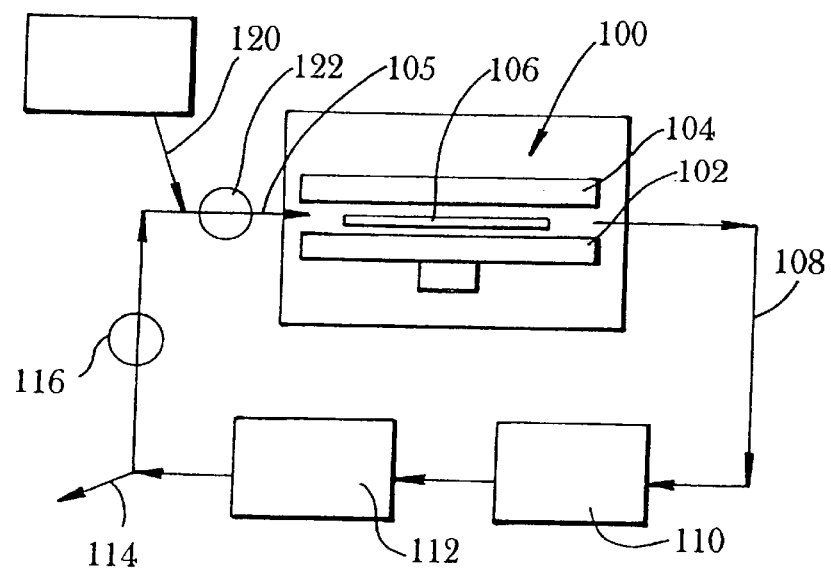

Referring now to the drawings, FIG. 1 is an enlarged sectional view showing a polishing pad in accordance with the present invention. The pad 10 comprises a polishing surface 12 comprising a low modulus phase material 14 having high modulus phase particles 16. Optional flow channels are shown at 18 and 20. FIG. 2 provides a schematic representation of a polishing process in accordance with the present invention. The polishing apparatus is shown generally at 100, comprising a table 102, workpiece 106 and polishing pad 104. Polishing fluid is pumped into the polishing interface (between the pad and workpiece) by influent line 105. Used polishing fluid exits the polishing apparatus via effluent line 108. The used polishing fluid is filtered by filter 110, and deionized by ion exchange column 112. Excess polishing fluid can be removed by waste line 114. Sensor 116 then monitors the pH or other chemical properties of the recycled fluid, and inlet line 120 provides appropriate additives to the recycled fluid, thereby rejuvenating it for another polishing cycle. Sensor 122 monitors the polishing fluid entering the polishing operation to ensure proper pH or other properties which are desired to be monitored for quality control.

Nothing from the above discussion is intended to be a limitation of any kind with respect to the present invention. All limitations to the present invention are intended to be found only in the claims, as provided below.

What is claimed is:

1. A polishing system for use in polishing a semiconductor device substrate at a polishing interface between the substrate and a polishing pad, comprising:
    a polishing pad having a polishing layer comprising a high modulus phase component and a low modulus phase component, the low modulus phase component having a critical surface tension greater than or equal to 34 milliNewtons per meter and a modulus less than about 10 GPa, the high modulus phase component having a modulus greater than about 10 GPa, the high modulus phase component comprising a plurality of ceramic particles having an average diameter of less than 1 micron, the polishing layer being subject to wear during polishing of the substrate, whereby as the surface of the polishing layer wears during said polishing of the substrate, nanoasperities are created at the polishing interface during said polishing, by at least a portion of the high modulus phase component being provided at the polishing interface, either as protrusions from said surface, or by being released from said surface to the polishing interface; and
    an aqueous polishing fluid located at the polishing interface, the aqueous polishing fluid comprising 0–50 weight percent abrasive particles having an average diameter of less than 1 micron.

2. A polishing system in accordance with claim 1 wherein the polishing fluid comprises a pH modifier, the low modulus phase component has a modulus of less than 1 GPa, and the high modulus phase component has a modulus of greater than 10 GPa.

3. A polishing system in accordance with claim 1, wherein the polishing fluid comprises less than 20 weight percent abrasive particles.

4. A polishing system in accordance with claim 1, wherein the polishing fluid comprises less than 5 weight percent abrasive particles.

5. A polishing system in accordance with claim 1 wherein the high modulus phase component comprises ceramic particles having an average particle size in the range of 0.1 to 0.4 microns, at least 50 weight percent of said particles being alumina, silica, ceria, or a combination thereof, and the weight ratio of said particles to the low modulus phase component is in the range of 0.0001:1 to 5:1.

6. A polishing pad for polishing a substrate, comprising:
    a polishing layer comprising a high modulus phase component and a low modulus phase component, the low modulus phase component having a critical surface tension greater than or equal to 34 milliNewtons per meter and a modulus less than about 10 GPa, the high modulus phase component having a modulus greater than about 10 GPa, the high modulus phase component comprising a plurality of ceramic particles having an average diameter of less than 1 micron, whereby as the polishing layer wears during said polishing at a polishing interface between the polishing layer and the substrate, nanoasperities are created by at least a portion of the high modulus phase component being provided at the polishing interface, either as protrusions from said surface, or by being released from said surface to the polishing interface.

7. A polishing pad in accordance with claim 6, further comprising a plurality of particle clusters held by the polishing layer, said particle clusters containing the high modulus phase component and a different material that provides a phase which is separate and distinct from the high modulus phase of the high modulus phase component, said particle clusters having an average size in the range of 10 to 1000 microns.

8. A polishing pad in accordance with claim 7, wherein the particle clusters have an average size in the range of 25–500 microns.

9. A polishing pad in accordance with claim 6 further comprising at least one groove, at least a portion of said high modulus phase component being located within said groove.

10. A polishing pad in accordance with claim 6, wherein at least a portion of the low modulus phase component is sintered.

11. A polishing pad in accordance with claim 6, wherein at least a portion of the high modulus phase component is adhered to a surface of the polishing layer.

12. A polishing pad in accordance with claim 6, wherein the polishing layer has a surface texture comprising a non-random pattern.

13. A polishing system using a polishing pad for polishing a semiconductor device substrate at a polishing interface between the substrate and said polishing pad, comprising:
    an aqueous polishing fluid comprising 0–50 weight percent abrasive particles having an average diameter of less than 1 micron; and said aqueous polishing fluid being adapted for use with said polishing pad having a polishing layer comprising a high modulus phase component and
    a low modulus phase component, the low modulus phase component having a critical surface tension greater than or equal to 34 milliNewtons per meter and a modulus less than about 10 GPa, the high modulus phase component having a modulus greater than about 10 GPa, the high modulus phase component comprising a plurality of ceramic particles having an average diameter of less than 1 micron, the polishing layer being subject to wear during polishing of the substrate, whereby as the surface of the polishing layer wears during said polishing of the substrate, nanoasperities are created at the polishing interface, by at least a portion of the high modulus phase component being provided at the polishing interface, either as protrusions from said surface, or by being released from said surface to the polishing interface.

14. A polishing system using an aqueous polishing fluid for polishing a semiconductor device substrate at a polishing interface, comprising:
    a polishing pad having a polishing layer comprising a high modulus phase component and a low modulus phase component, the low modulus phase component having a critical surface tension greater than or equal to 34 milliNewtons per meter and a modulus less than about 10 GPa, the high modulus phase component having a modulus greater than about 10 GPa, the high modulus phase component comprising a plurality of ceramic particles having an average diameter of less than 1 micron, the polishing layer being subject to wear during polishing of the substrate, whereby as the surface of the polishing layer wears during said polishing of the substrate, nanoasperities are created at the polishing interface that is between the substrate and the polishing pad, the nanoasperities being created by at least a portion of the high modulus phase component being provided at the polishing interface, either as protrusions from said surface, or by being released from said surface to the polishing interface; and the polishing pad being adapted for use with said aqueous polishing fluid comprising 0–50 weight percent abrasive particles having an average diameter of less than 1 micron.

\* \* \* \* \*